US009461564B2

(12) United States Patent
Skotnicki

(10) Patent No.: US 9,461,564 B2
(45) Date of Patent: Oct. 4, 2016

(54) THERMO-MECHANO-ELECTRICAL CONVERTER

(75) Inventor: Thomas Skotnicki, Crolles-Monfort (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 574 days.

(21) Appl. No.: 14/009,325

(22) PCT Filed: Mar. 26, 2012

(86) PCT No.: PCT/FR2012/050618
§ 371 (c)(1),
(2), (4) Date: Apr. 10, 2014

(87) PCT Pub. No.: WO2012/168592
PCT Pub. Date: Dec. 13, 2012

(65) Prior Publication Data
US 2015/0015112 A1    Jan. 15, 2015

(30) Foreign Application Priority Data
Apr. 1, 2011    (FR) .................................... 11 52806

(51) Int. Cl.
*H02N 2/18*  (2006.01)
*H02N 11/00*  (2006.01)
*F03G 7/06*  (2006.01)
*H01L 41/113*  (2006.01)

(52) U.S. Cl.
CPC ............ *H02N 11/002* (2013.01); *F03G 7/065* (2013.01); *H02N 2/18* (2013.01); *H01L 41/1134* (2013.01)

(58) Field of Classification Search
CPC ...... H02N 11/002; H02N 2/18; F03G 7/065; F03G 7/06; H01L 41/053; H01L 41/0536
USPC ................ 310/306, 332, 339, 340, 346, 348
See application file for complete search history.

(56) References Cited

U.S. PATENT DOCUMENTS

| 8,227,955 | B1 * | 7/2012 | Mitchell | H02N 2/18 310/328 |
| 8,853,916 | B2 * | 10/2014 | Browne | G05G 1/02 310/328 |
| 2009/0315335 | A1 * | 12/2009 | Ujihara | F03G 7/065 290/1 R |
| 2010/0207491 | A1 * | 8/2010 | Gammaitoni | H02N 2/186 310/339 |
| 2011/0095646 | A1 * | 4/2011 | Skotnicki | H02N 2/18 310/306 |

FOREIGN PATENT DOCUMENTS

WO    WO 2007087383 A2    8/2007
WO    WO 2008099437 A1    8/2008

OTHER PUBLICATIONS

International Search Report dated Aug. 3, 2012 from corresponding International Application No. PCT/FR2012/050618.
Written Opinion dated Oct. 2, 2013 from corresponding International Application No. PCT/FR2012/050618.

* cited by examiner

*Primary Examiner* — Shawki S Ismail
*Assistant Examiner* — Bryan Gordon
(74) *Attorney, Agent, or Firm* — Seed IP Law Group PLLC

(57) ABSTRACT

A thermo-mechano-electric converter including a plurality of shape memory bistable elements embedded in a resilient material intimately associated with a piezoelectric material.

19 Claims, 2 Drawing Sheets

THERMO-MECHANO-ELECTRICAL CONVERTER

CROSS REFERENCE TO RELATED APPLICATIONS

The present application is the National Stage of international patent application No PCT/FR2012/050618, filed on Mar. 26, 2012, which claims the priority benefit of French patent application number 11/52806, filed on Apr. 1, 2011, which applications are hereby incorporated by reference to the maximum extent allowable by law.

BACKGROUND

1. Technical Field

Embodiments relate to a device capable of generating electric power from a heat source, or electric generator. It more specifically aims at the conversion of thermal power into mechanical power, and then into electric power to form a thermo-mechano-electrical generator.

2. Discussion of the Related Art

Various devices for converting thermal power into mechanical power are known, such devices especially comprising bimetallic elements having a structure varying along with temperature. Such bimetallic elements are especially used as electric switches.

Various devices for converting mechanical power into electric power, based on piezoelectric materials, are also known.

There is a need for devices capable of having a great variety of dimensions and low costs for converting thermal power into electric power.

SUMMARY

Thus, an embodiment aims at providing a device for converting thermal power into mechanical power, and then into electric power, which overcomes at least some of the disadvantages of prior art devices.

A more specific embodiment aims at providing such a device which is simple to form and that can be formed at a low cost.

Another embodiment aims at providing such a device that can have large dimensions.

Thus, an embodiment provides a thermo-mechano-electric converter comprising a plurality of bistable shape memory elements embedded in a resilient material intimately associated with a piezoelectric material.

"Intimately associated with a piezoelectric material" means that the resilient material may have piezoelectric properties or that the resilient material is combined with a layer of a piezoelectric material.

According to an embodiment, said elements are directly embedded in a layer or film of a resilient piezoelectric material.

According to an embodiment, the piezoelectric material is a polymer.

According to an embodiment, the resilient piezoelectric material is polyvinylidene fluoride.

According to an embodiment, the strips are arranged in a layer of a resilient material coated with a piezoelectric material.

According to an embodiment, the shape memory elements are in the form of strips.

According to an embodiment, the shape memory elements are bimetallic type elements.

According to an embodiment, the shape memory elements are assembled in a blade or in a plate comprising a large number of embedded elements.

The foregoing and other objects, features, and advantages will be discussed in detail in the following non-limiting description of specific embodiments in connection with the accompanying drawings.

DETAILED DESCRIPTION

A thermally bistable element having a first geometric configuration under a first temperature and a second geometric configuration above a second temperature is used herein, the first and second temperatures being spaced apart by one hysteresis interval.

Figure 1A:
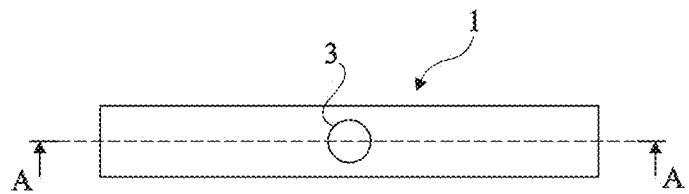
FIG. 1A is a top view of an example of a bistable bimetallic element.
Figure 1B:
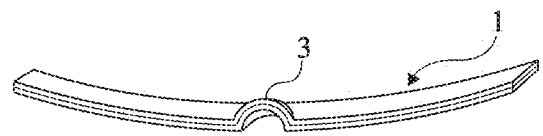
FIGS. 1B and 1C are perspective half section views of the bistable bimetallic element of FIG. 1A in each of its two configurations.
Figure 1C:
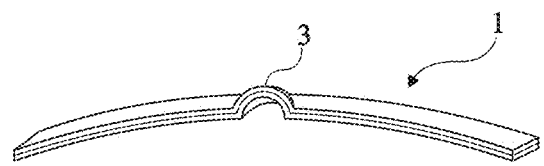

Among such bistable elements, bimetallic elements of the type shown in FIGS. 1A to 1C may be used.

FIG. 1A is a top view of a bimetallic strip 1 provided at its center with a protrusion 3. The strip has, at rest, for example, at low temperature, the position illustrated in perspective and half section view in FIG. 1B, that is, it is curved upwards. When the temperature rises up to a first transition value, the strip takes the position illustrated in FIG. 1C, that is, it is curved downwards. Then, when the temperature decreases to reach a second transition value separated from the first value by a hysteresis interval, the strip returns to the position illustrated in FIG. 1B.

By properly selecting the materials forming the strip, the first transition temperature may be selected in determined fashion, for example, 37° C., 65° C., or 100° C. and the hysteresis value may range from 5 to 20° C.

As underlined hereabove, the bistable bimetallic strip illustrated in FIGS. 1A, 1B, 1C is an example only of a mechanically bistable element. A bimetallic element having any other configuration may be selected. An element other than a bimetal, for example, an element formed of a shape memory material, may also be selected. "Shape memory element" will be used hereinafter to designate any mechanically bistable element taking one or the other of two geometric configurations according to temperature, such as described hereabove, be it formed of a bimetal or of any other material or combination of materials.

Figure 2:
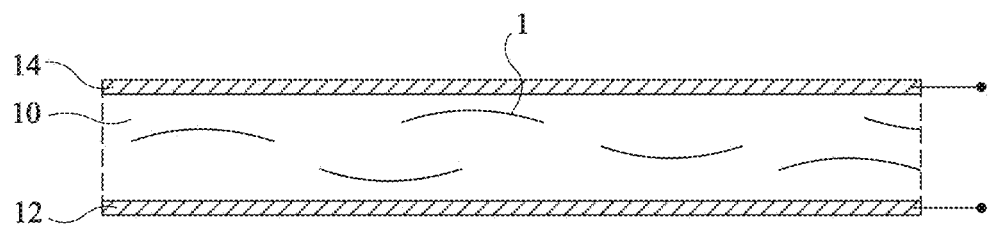
FIG. 2 is a cross-section view of an embodiment of a thermo-mechano-electrical generator.

FIG. 2 shows an embodiment of a thermo-mechano-electrical generator.

This generator comprises a film or layer of a resilient piezoelectric material, for example, an organic piezoelectric material such as a polymer, for example, polyvinylidene fluoride (PVDF). Bistable shape memory elements 1, for example, such as that shown in FIGS. 1A-1C, are embedded in this material. Piezoelectric material 10 is coated on its two surfaces with conductive layers, for example, metal layers, 12 and 14.

In operation, the structure or sheet illustrated in FIG. 2 is arranged between a hot source and a cold source. The hot source is at a temperature greater than the first transition temperature and the cold source is at a temperature lower than the second transition temperature.

Assuming that the sheet is, initially, at a cold temperature, such that all shape memory elements are in a first state, the elements arranged closest to the hot source will tend to change configuration after having reached the first transition temperature. At least some of these elements will then have portions which will move closer to the cold side of the sheet and thereby will tend to switch back to their other configuration. Such motions are repeated indefinitely, for at least some of the shape memory elements, and repeated stress on the piezoelectric material is thus obtained. This results in the generation of a voltage between terminals connected to electrodes 12 and 14. Although this has not been shown, it should be understood that, due to the deformation of the shape memory elements, the apparent surfaces of the sheet will be made to deform, this deformation being of variable amplitude according to the resilience of material 10.

The case where the shape memory elements are placed randomly inside of the structure has been described previously. It may also be provided to arrange these elements regularly, for example, substantially at the center of the sheet, with a proper orientation to promote the switching of all elements and not only of some of them.

Figure 3:
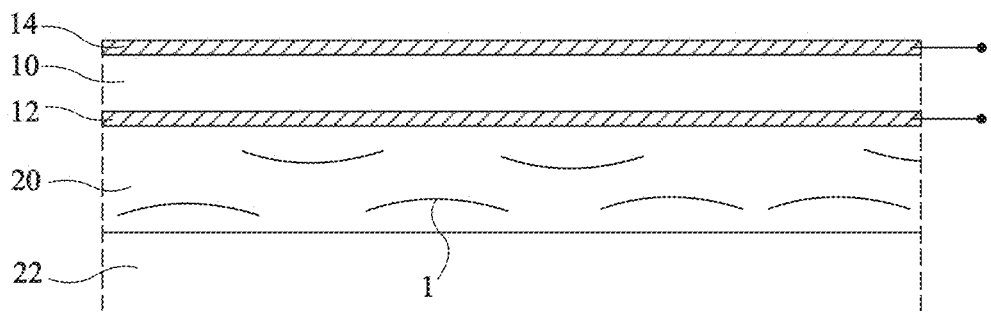
FIG. 3 is a cross-section view of another embodiment of a thermo-mechano-electrical generator.

FIG. 3 illustrates an alternative embodiment of the device described herein. In this case, piezoelectric material layer 10 located between metallizations 12 and 14 is arranged on the upper surface of a film or layer of resilient material 20 preferably arranged on a rigid support 22. Thus, the switchings from one state to the other of shape memory elements 1 embedded in resilient layer 20 will act on piezoelectric layer 10 to provide voltages between the terminals of the electrodes associated with this layer.

As indicated previously, the previously-described device is likely to have many variations.

It may have large dimensions, the shape memory strips for example having a length on the order of 3 cm and a width on the order of 1 cm.

Shape memory elements of very small dimensions, for example millimetric or even micrometric, may also be provided.

Figure 4:
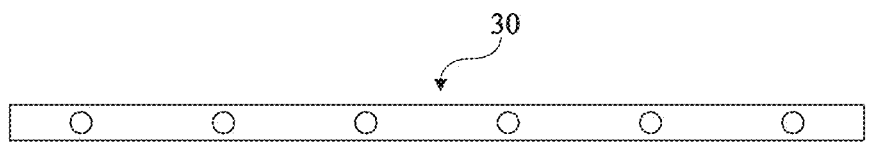
FIG. 4 is a top view of an example of bistable bimetallic elements extending in one direction.
Figure 5:
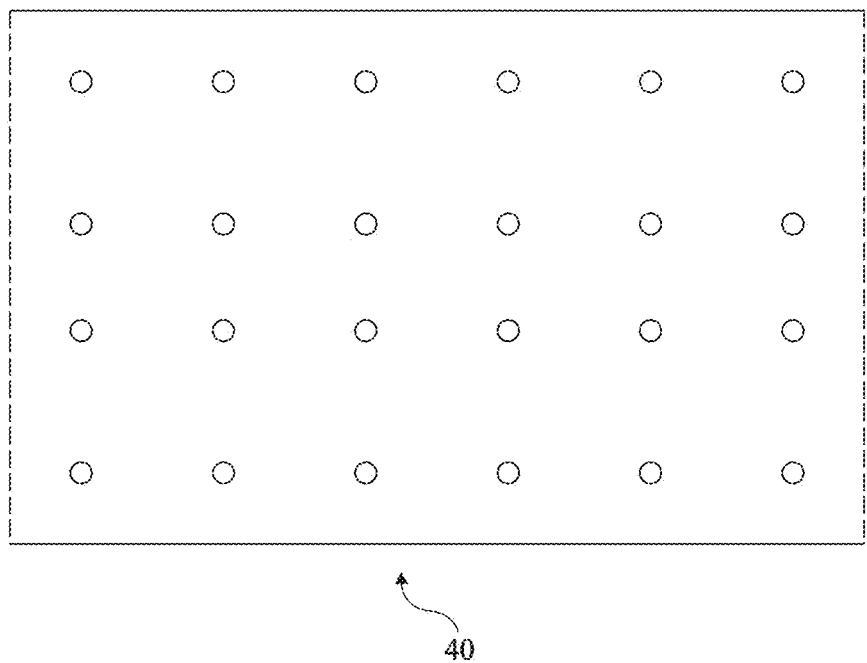
FIG. 5 is a top view of bistable bimetallic elements extending in a plane.

Further, as illustrated in FIG. 4, instead of providing separate strips, blades 30 formed of the abutting of strips such as those described previously may be provided. It may also be provided for the strips to be assembled in planes 40 as illustrated in FIG. 5. This provides a bistable blade or a sheet of shape memory material which may be arranged within a piezoelectric layer or a resilient material linked to this piezoelectric layer.

Although elements in the form of strips have been shown, any other configuration, for example, in a star, in a circle, or other, of the shape memory elements may be provided.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A thermo-mechano-electric converter comprising:
   a resilient material intimately associated with a piezoelectric material; and
   a plurality of bistable shape memory elements embedded in the resilient material intimately associated with the piezoelectric material.

2. The converter of claim 1, wherein the resilient material intimately associated with a piezoelectric material includes a layer or film of a resilient piezoelectric material and said elements are directly embedded in the layer or film of the resilient piezoelectric material.

3. The converter of claim 2, wherein the resilient piezoelectric material is a polymer.

4. The converter of claim 3, wherein the resilient piezoelectric material is polyvinylidene fluoride.

5. The converter of claim 1, wherein the shape memory elements are strips.

6. The converter of claim 5, wherein the resilient material intimately associated with a piezoelectric material includes a layer of a resilient material and the piezoelectric material coating the layer of the resilient material, and the strips are arranged in the layer of the resilient material coated with the piezoelectric material.

7. The converter of claim 1, wherein the shape memory elements are bimetallic elements.

8. The converter of claim 1, wherein the shape memory elements are assembled in a blade or in a plate that includes a large number of embedded elements.

9. The converter of claim 1, further comprising first and second metal layers respectively positioned on opposite sides of the resilient material intimately associated with the piezoelectric material.

10. The converter of claim 1, wherein the resilient material intimately associated with the piezoelectric material includes:
    a layer of resilient material in which the shape memory elements are embedded;
    a first metal layer on the layer of resilient material; and
    a piezoelectric layer on the metal layer.

11. The converter of claim 10, further comprising a second metal layer positioned on the piezoelectric layer, the piezoelectric layer being positioned between the first and second metal layers and the first metal layer being positioned between the layer of resilient material and the piezoelectric layer.

12. A thermo-mechano-electric conversion system comprising:
    thermo-mechano-electric converter including:
        a resilient material intimately associated with a piezoelectric material; and
        a plurality of bistable shape memory elements embedded in the resilient material intimately associated with the piezoelectric material;
    a heat source adjacent to a first side of the thermo-mechano-electric converter; and
    a cold source adjacent to a second side of the thermo-mechano-electric converter, the second side being opposite to the first side.

13. The thermo-mechano-electric conversion system of claim 12, wherein the resilient material intimately associated with a piezoelectric material includes a layer or film of a resilient piezoelectric material and said elements are directly embedded in the layer or film of the resilient piezoelectric material.

14. The thermo-mechano-electric conversion system of claim 12, wherein the shape memory elements are strips and the resilient material intimately associated with the piezoelectric material includes a layer of a resilient material and a piezoelectric material coating the layer of the resilient material, and the strips are arranged in the layer of the resilient material coated with the piezoelectric material.

15. The thermo-mechano-electric conversion system of claim 12, wherein the shape memory elements are bimetallic elements.

16. The thermo-mechano-electric conversion system of claim 12, wherein the shape memory elements are assembled in a blade or in a plate that includes a large number of embedded elements.

17. The thermo-mechano-electric conversion system of claim 12, wherein the thermo-mechano-electric converter includes first and second metal layers respectively positioned on opposite sides of the resilient material intimately associated with the piezoelectric material.

18. The thermo-mechano-electric conversion system of claim 12, wherein the resilient material intimately associated with the piezoelectric material includes:
   a layer of resilient material in which the shape memory elements are embedded;
   a first metal layer on the layer of resilient material; and
   a piezoelectric layer on the metal layer.

19. The thermo-mechano-electric conversion system of claim 18, further comprising a second metal layer positioned on the piezoelectric layer, the piezoelectric layer being positioned between the first and second metal layers and the first metal layer being positioned between the layer of resilient material and the piezoelectric layer.

* * * * *